United States Patent
Fujimori et al.

(10) Patent No.: US 8,581,354 B2
(45) Date of Patent: Nov. 12, 2013

(54) SEMICONDUCTOR DEVICE CARRYING MICRO ELECTRO MECHANICAL SYSTEM

(75) Inventors: Tsukasa Fujimori, Kokubunji (JP); Yuko Hanaoka, Kodaira (JP); Hiroshi Fukuda, London (GB)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/697,202

(22) Filed: Apr. 5, 2007

(65) Prior Publication Data

US 2008/0128841 A1 Jun. 5, 2008

(30) Foreign Application Priority Data

Nov. 30, 2006 (JP) .................................. 2006-323865

(51) Int. Cl.
*H01L 29/84* (2006.01)

(52) U.S. Cl.
USPC ................... 257/415; 257/419; 257/E29.324; 257/E23.118; 73/715; 73/714

(58) Field of Classification Search
USPC ......... 257/414, 415, 417, 418, 419, 787, 788, 257/E23.118, E29.324; 73/715, 754
See application file for complete search history.

(56) References Cited

U.S. PATENT DOCUMENTS

| 5,844,286 | A | 12/1998 | Hase |
| 6,518,083 | B2 * | 2/2003 | Sato et al. ........................ 438/50 |
| 6,584,852 | B2 * | 7/2003 | Suzuki et al. ................... 73/718 |
| 7,008,812 | B1 | 3/2006 | Carley |
| 2001/0009112 | A1 | 7/2001 | Delaye |
| 2002/0072144 | A1 | 6/2002 | Gogoi et al. |
| 2002/0131228 | A1* | 9/2002 | Potter .......................... 361/233 |
| 2002/0157475 | A1 | 10/2002 | Onose et al. |
| 2003/0215974 | A1* | 11/2003 | Kawasaki et al. ............... 438/50 |
| 2004/0173886 | A1 | 9/2004 | Carley |
| 2005/0087826 | A1* | 4/2005 | Rodgers et al. ............... 257/417 |
| 2005/0160826 | A1* | 7/2005 | Zdeblick et al. ................ 73/715 |
| 2006/0108675 | A1* | 5/2006 | Colgan et al. ................. 257/684 |

FOREIGN PATENT DOCUMENTS

| EP | 1 207 378 A1 | 5/2002 |
| JP | 2006-156182 | 6/2006 |
| WO | WO 2006/077565 A1 | 7/2006 |

\* cited by examiner

*Primary Examiner* — Robert Huber
(74) *Attorney, Agent, or Firm* — Miles & Stockbridge P.C.

(57) ABSTRACT

An object of the present invention is to enhance the reliability of an MEMS sensor formed on a semiconductor integrated circuit device. To achieve this object, a semiconductor device of the present invention comprises: a semiconductor integrated circuit device; a lower passivation film of silicon nitride, etc. . . . formed on the semiconductor integrated circuit device and having high moisture resistance and high chemical resistance; a MEMS portion formed on the lower passivation film and including a cavity 12; and an upper passivation film 11 formed on the top surface of the MEMS portion such that the MEMS portion is hermetically sealed by the upper and lower passivation films.

7 Claims, 6 Drawing Sheets

SEMICONDUCTOR DEVICE CARRYING MICRO ELECTRO MECHANICAL SYSTEM

CLAIM OF PRIORITY

The present application claims priority from Japanese application JP 2006-323865 filed on Nov. 30, 2006, the content of which is hereby incorporated by reference into this application.

BACKGROUND OF THE INVENTION

1. Field of the Invention

The present invention relates to a semiconductor device that includes a sensor formed by use of an MEMS (Micro-Electro-Mechanical System) technique, and more particularly relates to a technique for enhancing the reliability of sensors.

2. Description of the Related Art

One conventional method for enhancing the reliability of a sensor formed by an MEMS technique is, for example, to passivate its top surface by forming a silicon nitride film, as disclosed in Japanese Patent Laid-Open No. 2006-156182. Specifically, according to the technique disclosed in this publication, a capacitive MEMS pressure sensor having a moving electrode (or a diaphragm electrode) and an opposing fixed electrode is formed on the top wiring layer of a semiconductor circuit device, and then the top layer including the MEMS sensor is passivated by forming a silicon nitride film thereon in order to enhance the environmental resistance of the device.

However, such a conventional technique is disadvantageous in that the sensor may exhibit drift in characteristics. One reason for this is that pinholes occur in the passivation film on the elevated step portions of the MEMS portion and, as a result, moisture penetrates into the MEMS sensor through these pinholes. Another reason is degradation of the quality of the films making up the MEMS sensor. In order to avoid these problems, a passivation film having a thickness of approximately one micron (such as used in conventional semiconductor integrated circuit devices) may be formed instead of the above passivation film (i.e., silicon nitride film). However, such an arrangement is difficult to apply to MEMS sensors, since it will greatly affect their operating characteristics. Further, in the case of pressure sensors, it is a challenge to maintain their reliability, since the pressure-sensitive portion formed on the semiconductor substrate must be directly exposed to the atmosphere.

SUMMARY OF THE INVENTION

To solve the above problems, the present invention provides a process for manufacturing a semiconductor device that includes a semiconductor integrated circuit device and an MEMS structure which is formed on the wiring layer of the semiconductor integrated circuit device. This process includes the steps of: forming a semiconductor integrated circuit device by a common semiconductor fabrication technique; planarizing the top surface of the semiconductor integrated circuit device; forming a lower passivation film on the top surface of the semiconductor integrated circuit device; forming an MEMS sensor portion (or structure) on the lower passivation film; and forming an upper passivation film to cover the MEMS portion and the semiconductor integrated circuit device portion. That is, the MEMS sensor portion is hermetically sealed by the upper and lower passivation films. With this arrangement, even if pinholes occur in the step portions of the upper passivation film, they will not affect the reliability of the device since the lower passivation film is located directly below these pinholes.

Major aspects of the present invention may be summarized as follows.

The present invention provides a semiconductor device comprising: a semiconductor integrated circuit device; a first passivation film disposed on the semiconductor integrated circuit device; an MEMS (Micro-Electro-Mechanical System) sensor disposed on the first passivation film and including a cavity portion; and a second passivation film covering at least the cavity portion of the MEMS sensor.

According to another aspect of the present invention, the first and second passivation films are partially in contact with each other at edge portions of the cavity portion of the MEMS sensor so as to seal the MEMS sensor. Thus, the MEMS sensor portion is hermetically sealed by the passivation films.

According to still another aspect of the invention, a first electrode and a second electrode are disposed over and under, respectively, the cavity portion so as to form a variable capacitor, the first and second electrodes facing a surface of the semiconductor integrated circuit device.

According to yet another aspect of the present invention, the first passivation film disposed under the cavity portion has a larger thickness than the second passivation film disposed over the cavity portion.

According to still a further aspect of the present invention, the first and second passivation films are silicon nitride films. This is a practical selection.

According to yet another aspect of the present invention, the semiconductor device further comprises an intermediate electrode disposed in the cavity portion so as to extend parallel to a surface of a substrate of the semiconductor integrated circuit device. With this arrangement, the semiconductor device can sense even a small force due to acceleration, for example.

Thus, the present invention allows an MEMS sensor formed on a semiconductor integrated circuit device to have high reliability by hermetically sealing the MEMS sensor portion with passivation films. Further, the present invention provides a device structure that does not interfere with the operation of the MEMS sensor portion while allowing hermetic sealing of the MEMS sensor portion, resulting in enhanced reliability of the MEMS sensor.

DETAILED DESCRIPTION OF THE PREFERRED EMBODIMENTS

Preferred embodiments of the present invention will be described in detail with reference to the accompanying drawings. It should be noted that in the following figures, like numerals will be generally used to denote like components to avoid undue repetition.

First Embodiment

Figure 1:
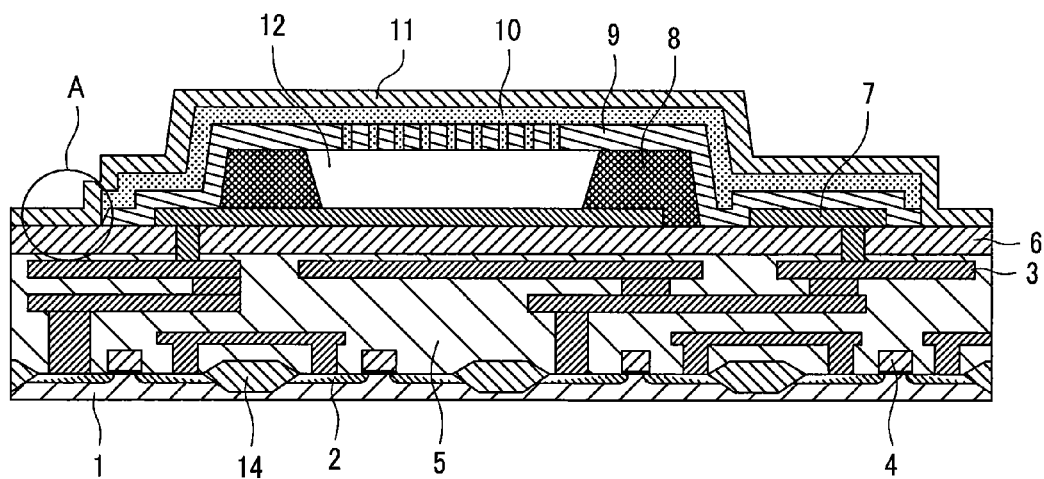
FIG. 1 is a schematic cross-sectional view of a pressure sensor according to a first embodiment of the present invention.

A first embodiment of the present invention will be described with reference to a capacitive MEMS pressure sensor formed on the top wiring layer of a semiconductor integrated circuit device. FIG. 1 is a cross-sectional view of the MEMS pressure sensor. As shown in FIG. 1, a lower passivation film layer 6 is provided on the surface of the wiring layer of a semiconductor integrated circuit device formed on a semiconductor substrate, and the pressure sensor is provided on the lower passivation film layer 6. The pressure sensor includes a lower electrode layer 7 (formed on the lower passivation layer 6) and an upper electrode layer 9, which together form a capacitance. The cavity 12 between the lower electrode layer 7 and the upper electrode layer 9 is sealed by an insulating sealing film layer 10 and an upper passivation film 11. The cavity 12 permits the upper electrode layer 9 to be deformed under external pressure, which results in a change in the capacitance between the upper and lower electrode layers 9 and 7. That is, the pressure sensor forms a variable capacitor whose capacitance varies with pressure, and this change in the capacitance allows sensing of a change in the pressure. It should be noted that the semiconductor integrated circuit device portion (under the MEMS portion) has a general semiconductor device configuration, and FIG. 1 shows components such as diffusion layers 2, gate electrodes 4, wiring 3, an interlayer insulating film 5, and oxide layers 14. Reference numeral 8 denotes a sacrificial interlayer insulating film which is a TEOS film or an $SiO_2$ film formed by plasma CVD. It should be noted that since the semiconductor integrated circuit device portion has a general semiconductor device configuration (as described above), a detailed description thereof will not be provided.

There will now be described a process for forming a capacitive pressure sensor with reference to FIGS. 1 to 10.

Figure 2:
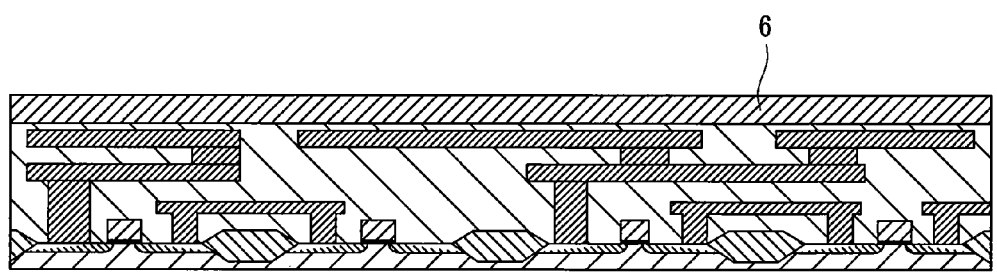
FIGS. 2 to 9 are cross-sectional views illustrating sequential process steps for manufacturing a pressure sensor according to the first embodiment of the present invention.

The process begins by forming an integrated circuit device on an Si substrate 1 by use of a common semiconductor process technique. After forming the top wiring layer of the integrated circuit device, its surface is planarized by CMP (Chemical Mechanical Polishing). After this planarization, a lower passivation film layer 6 is formed to a thickness of approximately 200 nm, as shown in FIG. 2. This passivation film 6 may preferably be a silicon nitride film, which is commonly used as a passivation film for semiconductor integrated circuit devices and has high moisture resistance and high chemical resistance. Of course, an insulating film formed of silicon carbide or aluminum oxide may be used instead of a silicon nitride film since these materials also have high moisture resistance and high chemical resistance. It should be noted that in FIGS. 2 to 10, components common to FIG. 1 may not bear a reference numeral.

Figure 3:
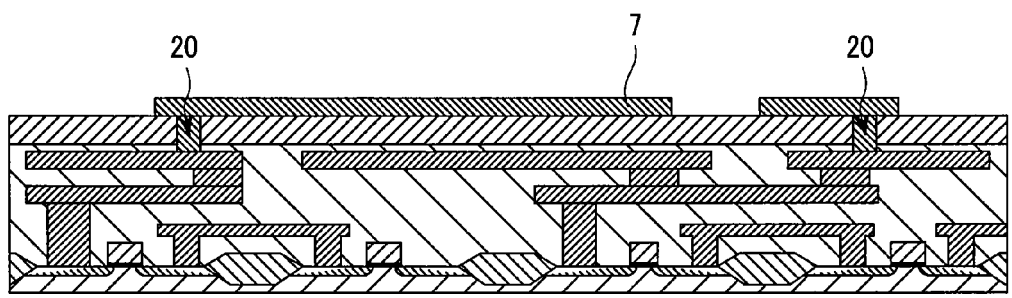

Then, after forming contact holes 20 in the wiring layer, a lower electrode layer 7 is formed and processed to a thickness of approximately 50 nm, as shown in FIG. 3. The lower electrode layer 7 may be made of any metal that can be used to form a wiring layer by a common semiconductor process. For example, the lower electrode layer 7 may be formed of aluminum, tungsten, tungsten silicide, titanium, titanium nitride, molybdenum, etc.

Figure 4:
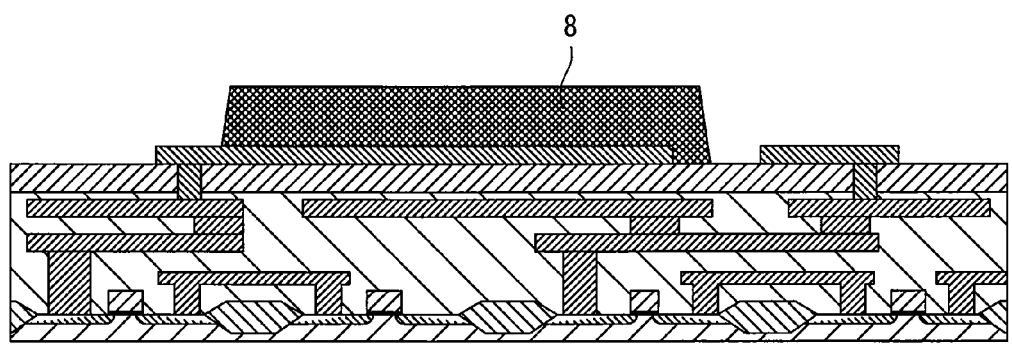

Then, a sacrificial interlayer insulating film 8 is formed on the surface and processed to a thickness of approximately 500 nm, as shown in FIG. 4. It should be noted that the sacrificial interlayer insulating film 8 is formed by a common semiconductor process.

Figure 5:
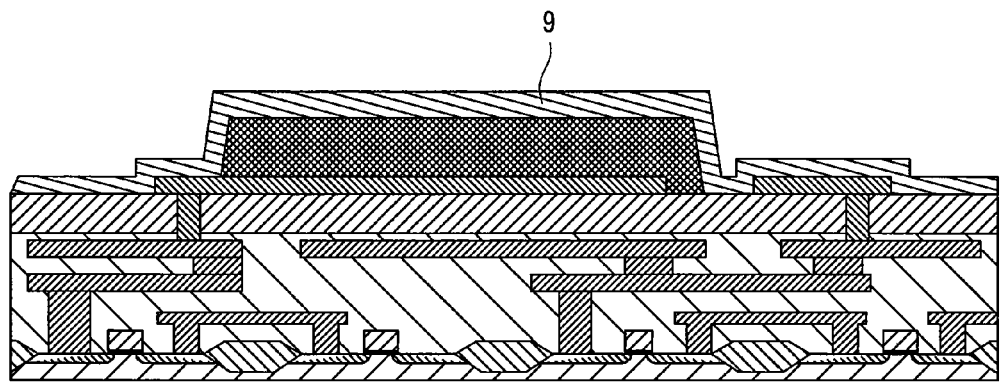

Then, an upper electrode layer 9 is formed to a thickness of approximately 500 nm, as shown in FIG. 5. The upper electrode layer 9 is preferably formed of a metal that can be used to form a wiring layer by a common semiconductor process and that has high moisture resistance and high chemical resistance. That is, the upper electrode layer 9 is preferably formed of tungsten, tungsten silicide, etc. Further, the upper electrode layer 9 preferably has a tensile stress (internal stress) of approximately 500 MPa to allow the sensor portion having a cavity to function properly.

Figure 6:
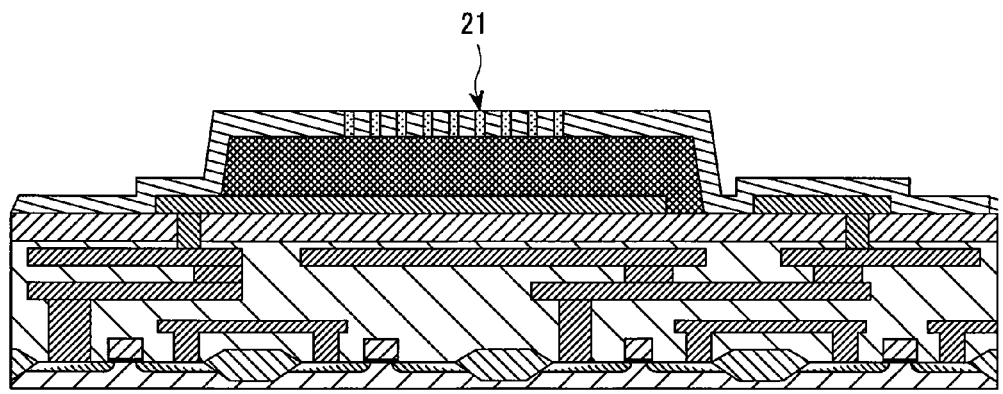
Figure 7:
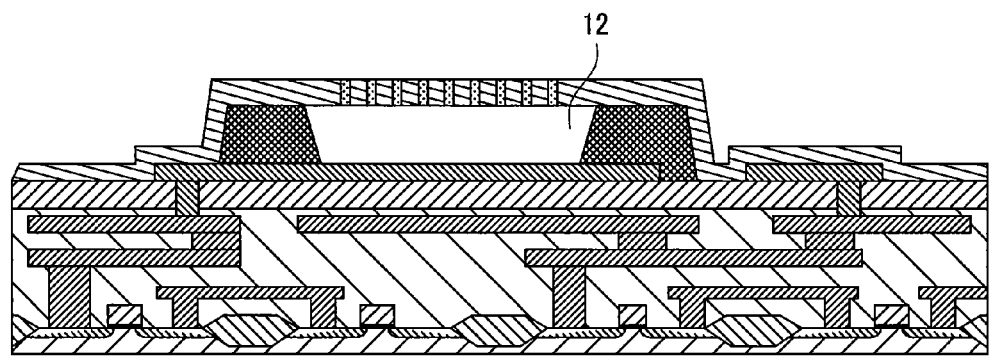

Then, small holes 21 having a diameter of approximately 200 nm are formed in the upper electrode layer 9, as shown in FIG. 6. After that, isotropic etching is performed through these small holes 21 to form a cavity 12, as shown in FIG. 7. This isotropic etching process uses a chemical solution such as hydrofluoric acid, or vapor. The etching time is adjusted to form the cavity 12 to a desired size.

Figure 8:
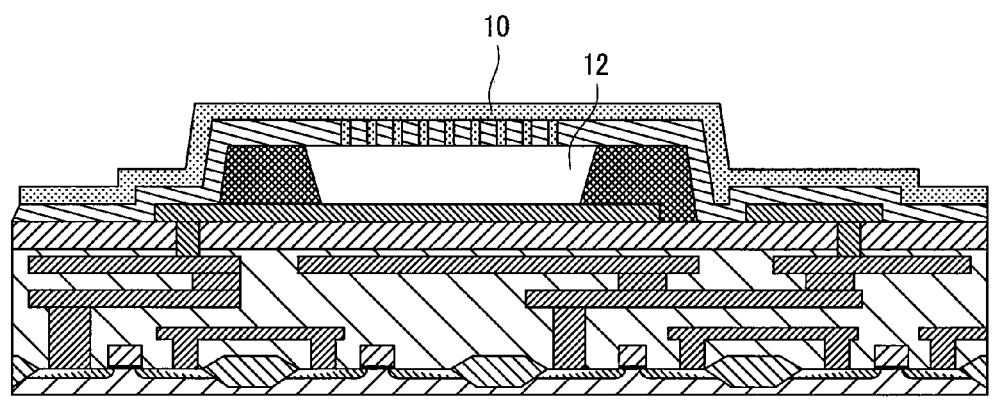

Then, an insulating sealing film 10 is formed of an interlayer insulating film material to a thickness of approximately 300 nm to completely seal the cavity 12, as shown in FIG. 8. This is done by using a coating technique that has superiority in terms of film formation, such as atmospheric pressure CVD. Use of such a technique allows the small holes to be closed or filled before the cavity is completely filled, leaving an empty space within the cavity.

Figure 9:
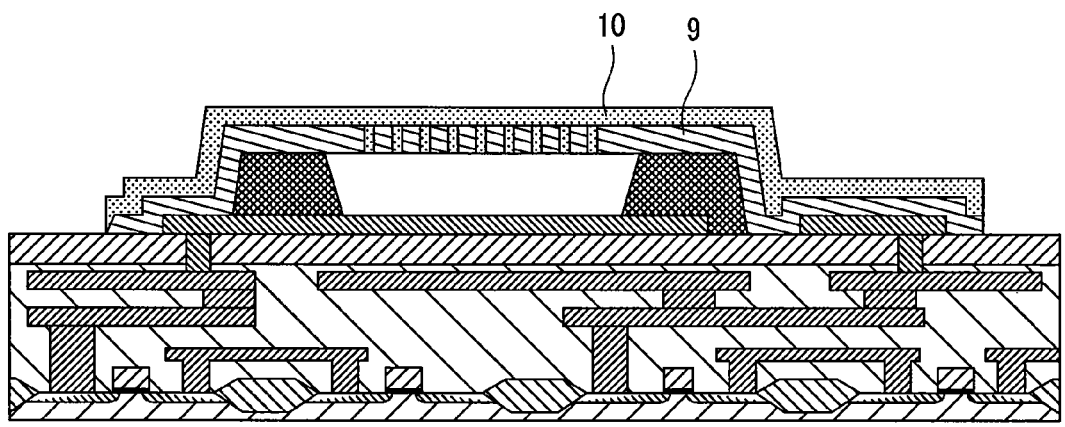

Then, the upper electrode layer 9 and the insulating sealing film 10 are processed to desired shapes, as shown in FIG. 9. Lastly, an upper passivation film 11 is formed to a thickness of approximately 150 nm to cover the entire surface, as shown in FIG. 1. Like the lower passivation film 6, the upper passivation film 11 is formed of a material having high moisture resistance and high chemical resistance, such as silicon nitride. However, it preferably has a tensile stress (internal stress) of 0-200 MPa to allow the shape of the cavity 12 to be appropriately altered. The insulating sealing film 10 and the upper passivation film 11 together must have a certain tensile stress to allow the sensor portion having the cavity to function properly as described above. Further, the upper passivation film 11 must have a thickness that allows the sensor portion to have sufficient moisture resistance while allowing the upper electrode layer 9 to be deformed under pressure. Therefore, the upper passivation film 11 is formed to a thickness of approximately 150 nm-200 nm (see FIG. 1). In general, the upper passivation film 11 must have a thickness of at least approximately 150 nm to properly function. However, excessively increasing the thickness of the upper passivation film 11 might result in interference with the function of the sensor portion having the cavity. Therefore, the maximum thickness of the upper passivation film 11 is generally approximately 500 nm although this may vary depending on the materials and the structures of the upper passivation film 11 and the insulating sealing film 10 and the upper electrode layer 9 underlying the upper passivation film 11, etc.

Figure 10:
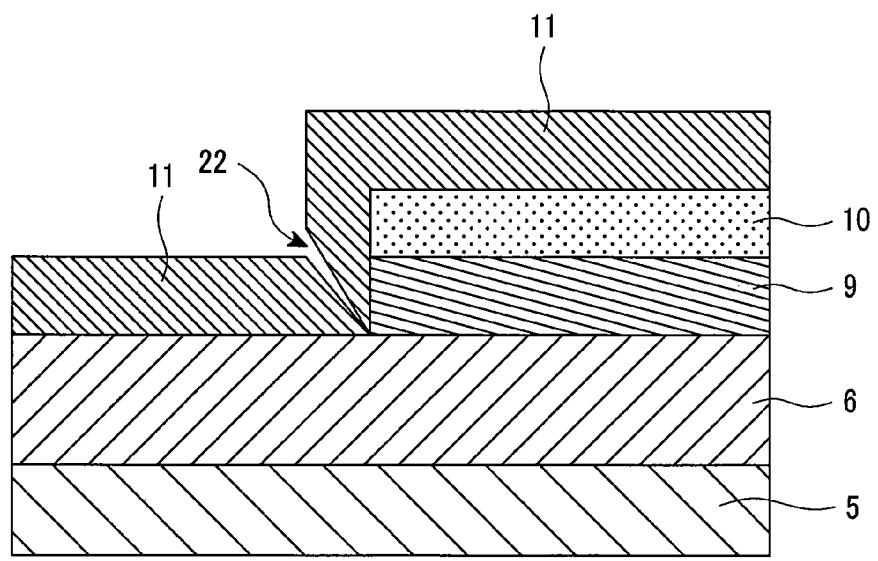
FIG. 10 shows an exemplary shape of a step portion of a passivation film according to the first embodiment of the present invention.

However, since the upper passivation film 11 has such a small thickness, a crack 22 may occur in the step portions of the film, as shown in FIG. 10, which may result in degraded reliability. FIG. 10 is a schematic enlarged view of the area in the circle on the left side of FIG. 1. However, according to the present invention, since the lower passivation film 6 is formed below the step portions, there is a reduced possibility of degraded reliability of the device. This means that the thickness of the upper passivation film 11 can be reduced to the minimum value required for proper functioning. Further, regions of the device other than the cavity 12 (i.e., the semiconductor integrated circuit device region, etc.) are protected by both the upper passivation film 11 and the lower passivation film 6, resulting in enhanced reliability of the semiconductor integrated circuit device region.

Second Embodiment

Figure 11:
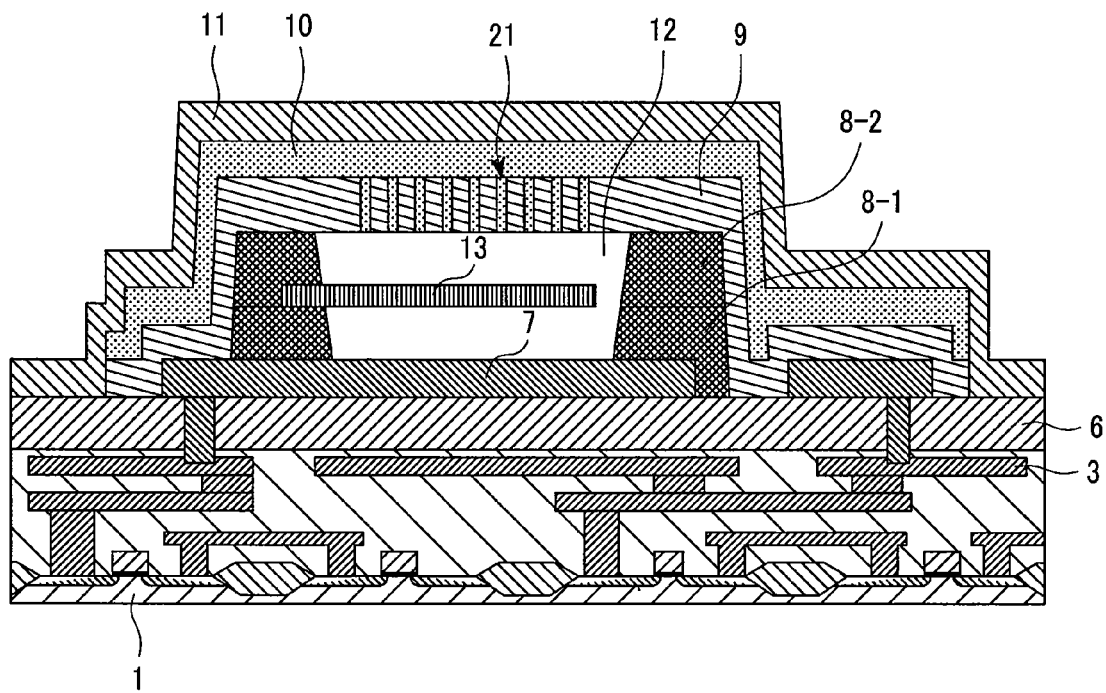
FIG. 11 is a schematic cross-sectional view of an acceleration sensor according to a second embodiment of the present invention.

A second embodiment of the present invention is directed to MEMS structures with a cavity other than pressure sensors. The present embodiment will be described with reference to a capacitive MEMS acceleration sensor formed on the top wiring layer of a semiconductor integrated circuit device. FIG. 11 is a cross-sectional view of this acceleration sensor. The acceleration sensor shown in FIG. 11 includes a moving electrode layer 13 designed to be able to be deformed even by small force, as in the pressure sensor of the first embodiment. This allows the acceleration sensor to sense an acceleration applied thereto by sensing the resultant movement (or deformation) of the moving electrode layer 13. There will now be described a process for manufacturing the MEMS structure (or capacitive MEMS acceleration sensor) of the present embodiment. After forming integrated circuit wiring 3 on a semiconductor integrated circuit substrate 1 (see FIG. 11), the surface of the substrate 1 is planarized. Then, a lower passivation film layer 6 is formed on the substrate 1, and a lower electrode layer 7 and an upper electrode layer 9 are formed above the lower passivation film layer 6. The moving electrode layer 13 is formed between the upper and lower electrode layers 9 and 7 in the following manner. After forming a first sacrificial insulating film 8-1 on the lower electrode layer 7 to a predetermined thickness, the moving electrode layer 13 is formed as shown in FIG. 11. Then, a second sacrificial insulating film 8-2 is formed on the moving electrode layer 13 and the first sacrificial insulating film 8-1. The first and second sacrificial insulating films 8-1 and 8-2 together correspond to the sacrificial interlayer insulating film 8 of the first embodiment. The steps following this step are the same as those described in connection with the first embodiment. For example, small holes 21 are formed in the upper electrode layer 9, and isotropic etching is performed through these small holes 21 to form a cavity 12, as described above.

The moving electrode layer 13 is designed to be able to be deformed even by small force, as described above. Therefore, when an acceleration is applied to the sensor, the moving electrode layer 13 moves (or changes shape), resulting in a change in the capacitance between the upper and lower electrode layers 9 and 7. This change in the capacitance allows sensing of the applied acceleration. Since the cavity 12 between the lower electrode layer 7 and the moving electrode layer 13 (or the upper electrode layer 9) is sealed by the insulating sealing film 10 and the upper passivation film 11 as in the first embodiment, there is no possibility of malfunction of the moving portion (or moving electrode layer 13) due to foreign particles. It should be noted that components of the device shown in FIG. 11 other than those in the above moving portion are basically similar to those shown in FIG. 1.

A crack or pinhole might occur in the step portions of the upper passivation film 11. However, since the lower passivation film 6 is formed below these step portions, there is a reduced possibility of degraded reliability of the device, as in the first embodiment.

It should be noted that although preferred embodiments of the present invention have been described with reference to an MEMS pressure sensor and an MEMS acceleration sensor, the passivation methods of the present invention can be applied to other MEMS structures having a cavity.

Thus, the present invention enables a variety of sensors employing a cavity to achieve high reliability.

The following are reference numerals used in the drawings of this specification.

1 . . . silicon substrate
2 . . . diffusion layer
3 . . . wiring
4 . . . gate electrode
5 . . . interlayer insulating film
6 . . . lower passivation layer
7 . . . lower electrode layer
8 . . . sacrificial interlayer insulating film
9 . . . upper electrode layer
10 . . . insulating sealing film layer
11 . . . upper passivation layer
12 . . . cavity
13 . . . moving electrode layer
14 . . . oxide layer
20 . . . contact hole
21 . . . small hole
22 . . . crack or pinhole

What is claimed is:

1. A semiconductor device comprising:
a semiconductor integrated circuit device;
a MEMS pressure sensor disposed over said semiconductor integrated circuit device and forming a variable capacitor; said MEMS pressure sensor including a lower electrode, an upper electrode having holes, a cavity portion between said lower electrode and said upper electrode, and an insulating sealing film layer disposed on and covering said upper electrode to seal said holes;
a first silicon nitride film disposed between said semiconductor integrated circuit device and said lower electrode of said MEMS pressure sensor; and
a second silicon nitride film disposed on an upper surface of said insulating sealing film layer and covering said insulating sealing film layer,
wherein said first and second silicon nitride films are in direct contact with each other so as to hermetically seal said MEMS pressure sensor, and
wherein the upper silicon nitride layer is deformable with the upper electrode in response to pressure.

2. The semiconductor device as claimed in claim 1, further comprising:
a first wiring to connect said lower electrode to said semiconductor integrated circuit device; and
a second wiring to connect said upper electrode to said semiconductor integrated circuit device,
wherein said first silicon nitride film has holes through which said lower and upper electrodes are connected to said first and second wirings, respectively.

3. The semiconductor device as claimed in claim 1, wherein said upper and lower electrodes face a surface of said semiconductor integrated circuit device.

4. The semiconductor device as claimed in claim 1, wherein said first silicon nitride film has a larger thickness than said second silicon nitride film disposed over said cavity portion.

5. The semiconductor device as claimed in claim 1, further comprising:
an intermediate electrode disposed in said cavity portion so as to be spaced from an upper surface of said semiconductor integrated circuit device and to extend parallel to said upper surface.

6. The semiconductor device as claimed in claim 1, wherein no portion of said insulating sealing film layer sealing said holes is connected to said lower electrode via said cavity portion.

7. The semiconductor device as claimed in claim 1, wherein said insulating sealing film layer and said lower electrode are not in contact with each other.

* * * * *